United States Patent
Kim et al.

(10) Patent No.: US 11,265,021 B2
(45) Date of Patent: Mar. 1, 2022

(54) APPARATUS AND METHOD FOR ERROR RECOVERY IN MEMORY SYSTEM

(71) Applicant: SK hynix Inc., Gyeonggi-do (KR)

(72) Inventors: Kyungjin Kim, San Jose, CA (US); Jaedeog Cho, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 52 days.

(21) Appl. No.: 16/814,411

(22) Filed: Mar. 10, 2020

(65) Prior Publication Data

US 2021/0288670 A1    Sep. 16, 2021

(51) Int. Cl.
*H03M 13/00* (2006.01)
*H03M 13/15* (2006.01)
*G11C 11/409* (2006.01)
*H03M 13/43* (2006.01)
*H03M 13/11* (2006.01)

(52) U.S. Cl.
CPC ....... *H03M 13/1575* (2013.01); *G11C 11/409* (2013.01); *H03M 13/1128* (2013.01); *H03M 13/43* (2013.01)

(58) Field of Classification Search
CPC ......... H03M 13/1575; H03M 13/1128; H03M 13/43; G11C 13/1575
See application file for complete search history.

(56) References Cited

U.S. PATENT DOCUMENTS

| | | | |
|---|---|---|---|
| 8,301,986 B2* | 10/2012 | Jo | H03M 13/151 714/785 |
| 8,732,564 B2* | 5/2014 | Chinnici | H03M 13/1111 714/785 |
| 8,910,028 B1* | 12/2014 | Li | H03M 13/1125 714/795 |
| 9,111,626 B2* | 8/2015 | Kim | G11C 11/5642 |
| 9,378,765 B2* | 6/2016 | Cai | H03M 13/1111 |
| 9,397,698 B1 | 7/2016 | Burd et al. | |
| 9,405,615 B2* | 8/2016 | Sunwoo | G11C 13/0004 |
| 9,785,502 B2* | 10/2017 | Zamir | H03M 13/1102 |
| 9,804,919 B2* | 10/2017 | Yang | G06F 11/1076 |
| 10,043,582 B2 | 8/2018 | Alhussien et al. | |
| 10,103,748 B2* | 10/2018 | Hsu | H03M 13/658 |
| 10,116,333 B2* | 10/2018 | Zamir | H03M 13/116 |
| 10,547,328 B1* | 1/2020 | Li | H03M 13/1125 |
| 2018/0034477 A1* | 2/2018 | Zamir | H03M 13/1108 |

* cited by examiner

*Primary Examiner* — Esaw T Abraham
(74) *Attorney, Agent, or Firm* — IP & T Group LLP (57) ABSTRACT

A memory controller performs an error recovery operation. The controller performs a read operation on a select block using a select read level; decodes data associated with the read operation to generate a syndrome value; determines whether to stop, before a maximum number of iterations, the read operation and the decoding at the select read level, using the syndrome value; when it is determined to stop the read operation and the decoding at the select read level, selects a next read level in a sequence of read levels; and uses the next read level for a subsequent read operation.

14 Claims, 12 Drawing Sheets

APPARATUS AND METHOD FOR ERROR RECOVERY IN MEMORY SYSTEM

BACKGROUND

1. Field

Embodiments of the present disclosure relate to an error recovery scheme for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems use error recovery schemes for data, which is retrieved from a memory device.

SUMMARY

Aspects of the present invention include a memory system and a method for error recovery capable of reducing latency associated with data read and decoding.

In one aspect, a memory system includes a memory device including a plurality of blocks and a controller. The controller performs a read operation on a select block among the plurality of blocks using a select read level among a sequence of read levels; decodes data associated with the read operation to generate a syndrome value; determines whether to stop, before a maximum number of iterations, the read operation and the decoding at the select read level, using the syndrome value; when it is determined to stop the read operation and the decoding at the select read level, selects a next read level in the sequence of read levels; and uses the next read level for a subsequent read operation.

In another aspect, a method for operating a memory system includes a memory device including a plurality of blocks and a controller coupled to the memory device. The method includes: performing a read operation on a select block among the plurality of blocks using a select read level among a sequence of read levels; decoding data associated with the read operation to generate a syndrome value; determining whether to stop, before a maximum number of iterations, the read operation and the decoding at the select read level, using the syndrome value; when it is determined that to stop the read operation and the decoding at the select read level, selecting a next read level in the sequence of read levels; and using the next read level for a subsequent read operation.

Additional aspects of the present invention will become apparent from the following description.

DETAILED DESCRIPTION

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

Figure 1:
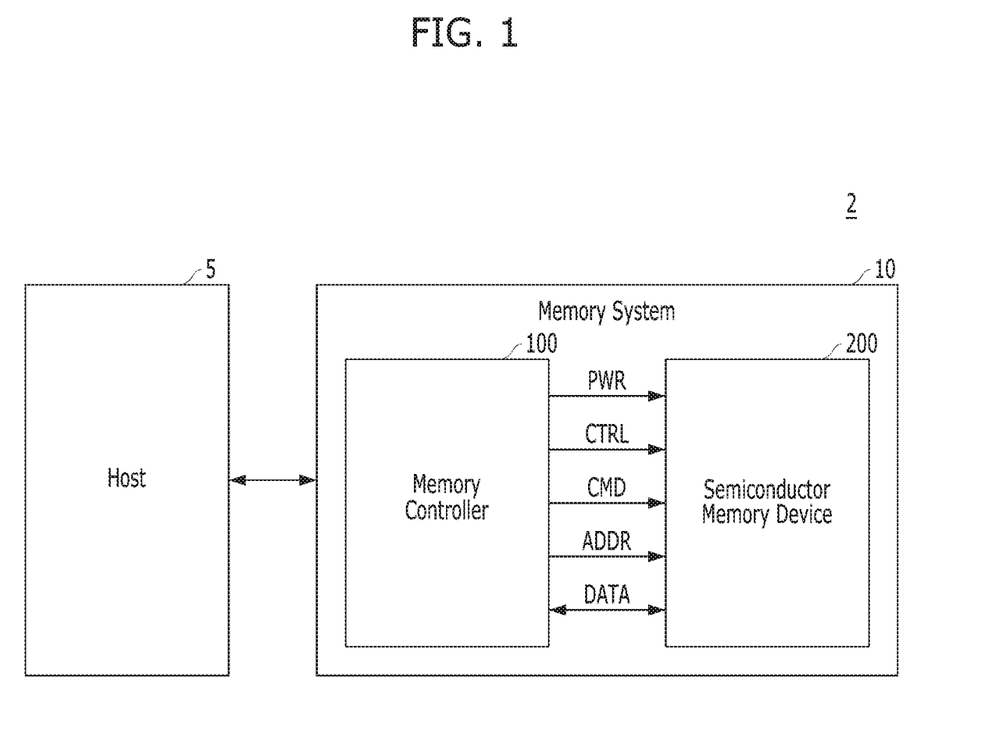
FIG. 1 is a block diagram illustrating a data processing system in accordance with an embodiment of the present invention.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
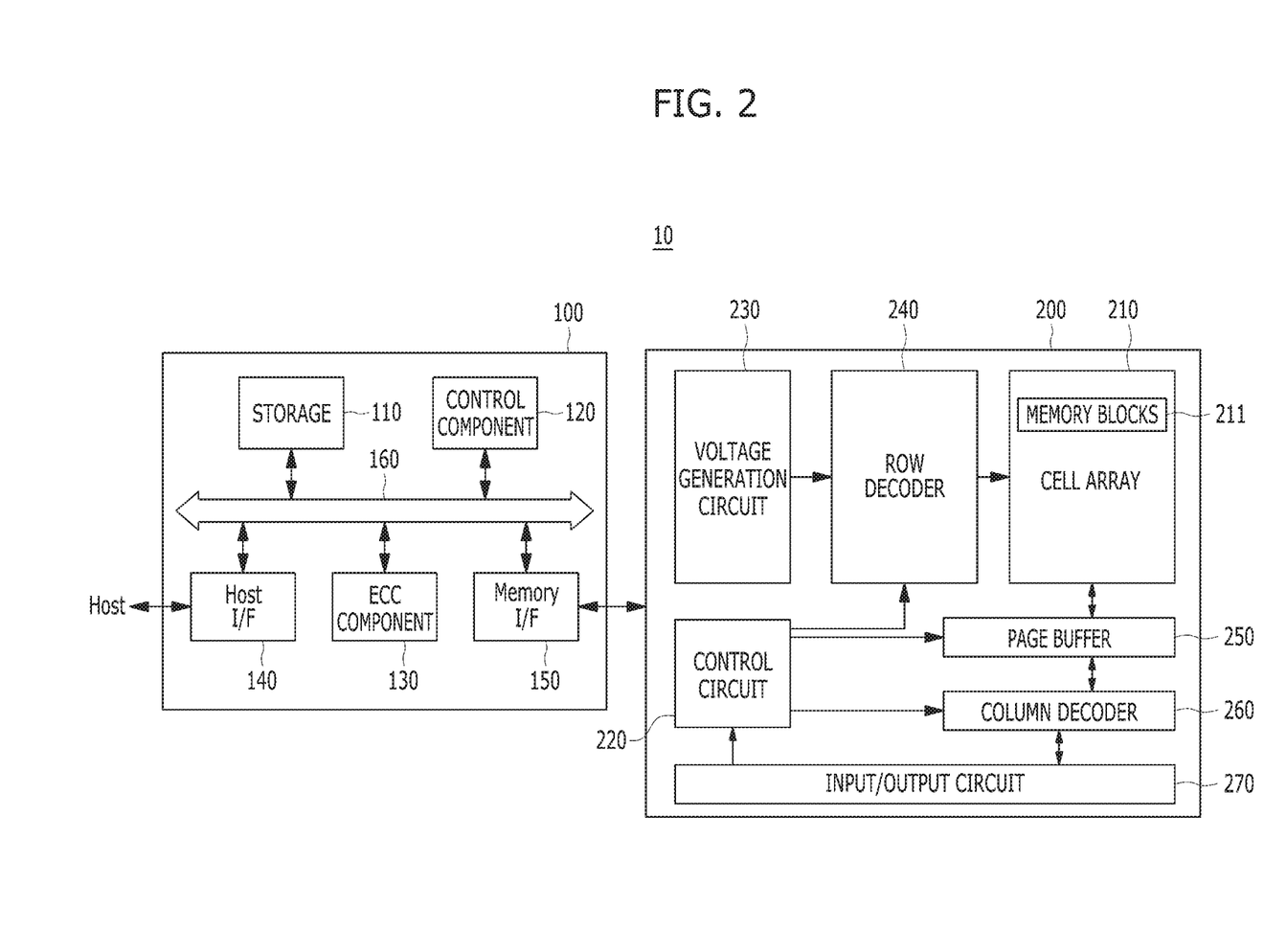
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDDC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
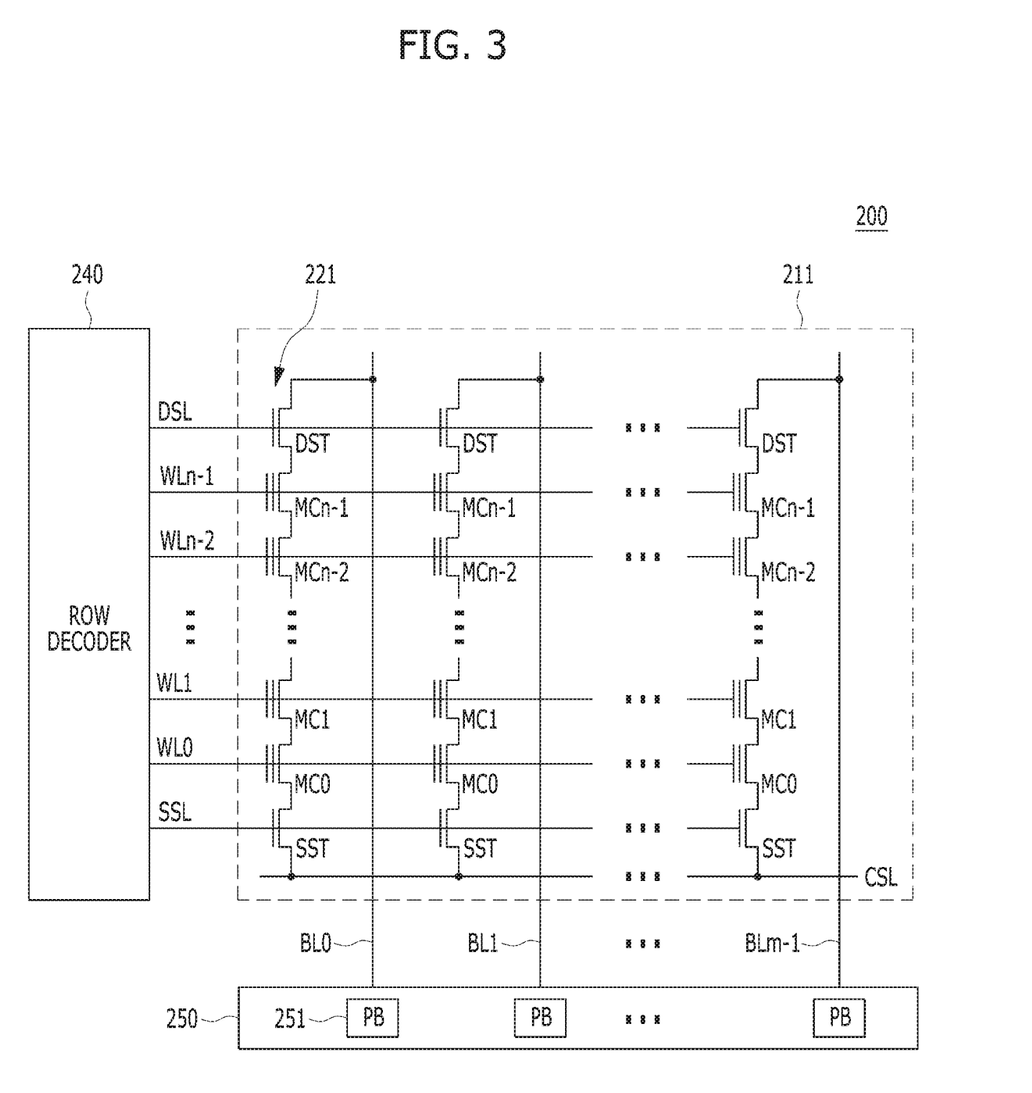
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL.

Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
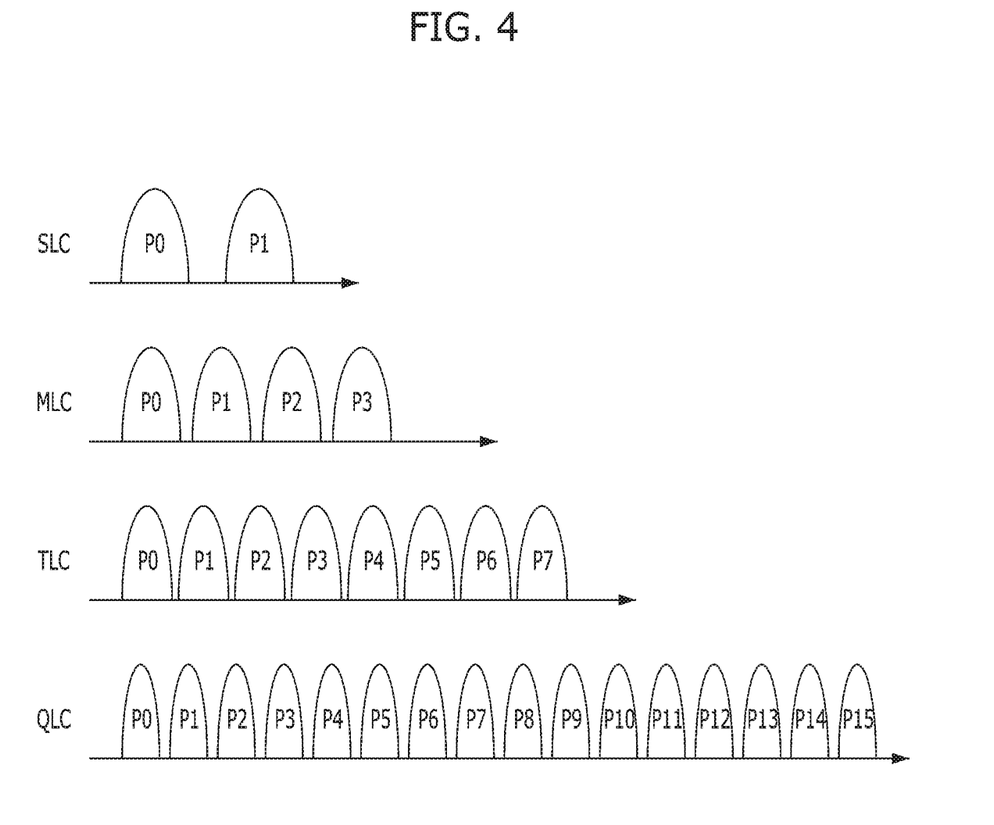
FIG. 4 is a diagram illustrating distributions of states for different types of cells of a memory device.

FIG. 4 is a diagram illustrating distributions of states or program voltage (PV) levels for different types of cells that may be employed in a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state (E), and P1 may indicate a program state. Since the SLC can be set in one of two different states, each SLC may program or store 1 bit according to a set coding method. An MLC may include four states P0, P1, P2 and P3. Among these states, P0 may indicate an erase state (E), and P1 to P3 may indicate program states. Since the MLC can be set in one of four different states, each MLC may program or store two bits according to a set coding method. A TLC may include eight states P0 to P7. Among these states, P0 may indicate an erase state (E), and P1 to P7 may indicate program states. Since the TLC can be set in one of eight different states, each TLC may program or store three bits according to a set coding method. A QLC may include 16 states P0 to P15. Among these states, P0 may indicate an erase state (E), and P1 to P15 may indicate program states. Since the QLC can be set in one of sixteen different states, each QLC may program or store four bits according to a set coding method.

As mentioned above, data is programmed in at least one memory cell of a select block among a plurality of blocks and the data is read from the memory cell. An error recovery flow may be performed to protect read data from uncorrectable error correction code (UECC) error. An error recovery flow may be performed through multiple error recovery stages as shown in FIG. 5.

Figure 5:
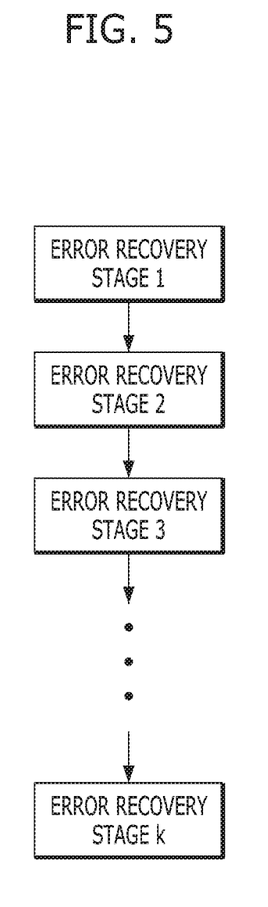
FIG. 5 illustrates an error recovery flow including multiple error recovery stages.

Referring to FIG. 5, the error recovery flow may include multiple error recovery stages including a first error recovery stage to a kth error recovery stage. Multiple error recovery stages use different set read levels, respectively. At each error recovery stage, a select read level is set and used to read and decode data until the data is decoded successfully or until a maximum number of decoding iterations are performed. If decoding has not succeeded within the maximum number of iterations, the error recovery flow goes to the next error recovery stage since the read level set in the previous stage is not an optimal read level. If decoding fails in all of the error recovery stages, the data is deemed uncorrectable, resulting in an uncorrectable error correction code (UECC) error. The UECC error may occur as a result of various factors such as high program and erase (PE) cycles, the number of reads and long data retention time. These factors lead to shifting and/or widening of a threshold voltage distribution, which changes optimal read points for states of memory cells and degrades read performance of a memory device (e.g., NAND flash).

Figure 6:
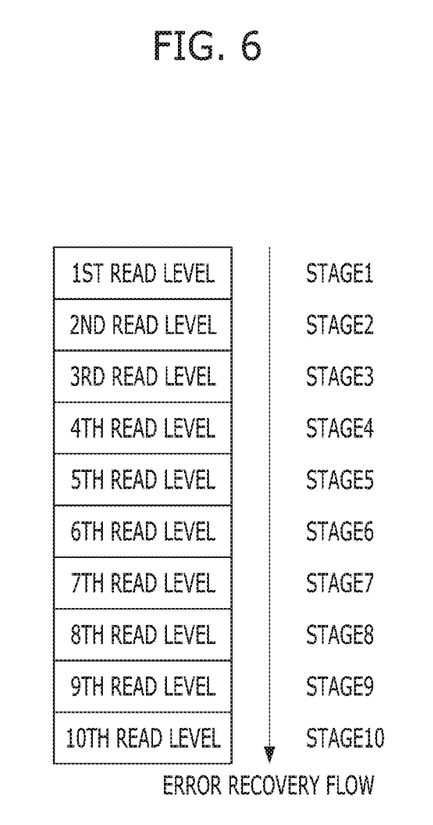
FIG. 6 illustrates an example of multiple read levels used in the error recovery flow shown in FIG. 5.

By way of example and without any limitation, there may be 10 error recovery stages, and 10 read levels are respectively pre-defined for the 10 error recovery stages, as shown in FIG. 6. For example, a first read level is set for a first error recovery stage, a second read level is set for a second error recovery stage, a third read level is set for a third error recovery stage and a tenth read level is set for a tenth error recovery stage. In order to determine whether data is decoded successfully or not, each stage may be performed a set maximum number of iterations. When a threshold voltage distribution changed due to high PE cycles and long retention, several decoding operations may be performed using some read levels. In FIG. 6, it is assumed that decoding of the data failed using the first to sixth read levels. Thereafter, if decoding succeeds at the seventh error recovery stage, the corresponding seventh read level is considered to be an optimal read level. As such, since some error recovery stages are performed without success the maximum number of iterations, decoding latency may increase. Further, in the worst case, if all, e.g., 10, error recovery stages are performed and none succeed, an optimal read level search algorithm may be performed. Accordingly, it is desirable to provide an error recovery scheme capable of reducing latency associated with read and decoding of data. Various embodiments may know whether a read level applied at each error recovery stage is optimal or not and reduce the latency. Thus, various embodiments require fewer number of reads and lead to more accurate read thresholds.

Figure 7:
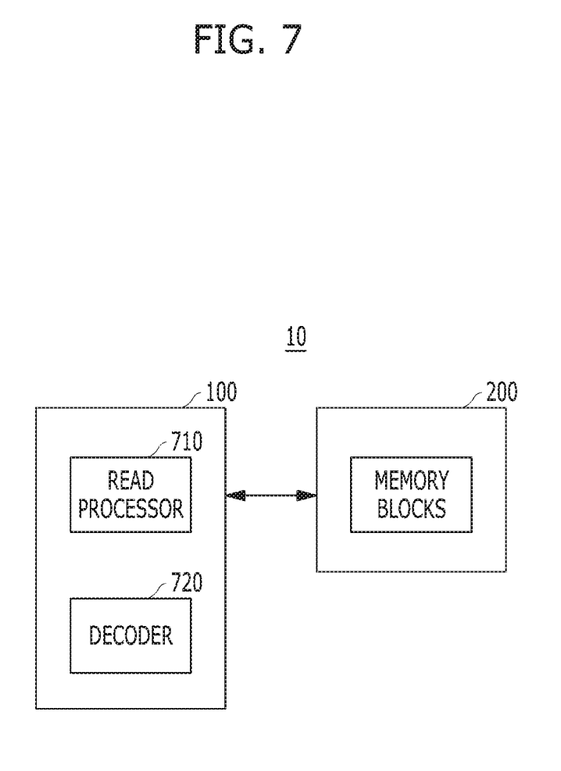
FIG. 7 is a diagram illustrating a memory system in accordance with an embodiment of the present invention.

FIG. 7 is a diagram illustrating a memory system 10 in accordance with an embodiment of the present invention.

Referring to FIG. 7, the memory system 10 may include a controller 100 and a memory device 200. The memory device 200 may include a plurality of memory blocks. Each memory block may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided on the bit line while the selected word line is asserted. During a read operation, the word line is again asserted, and the threshold voltage of each cell can then be acquired from the bit line. Multiple pages may share the memory cells coupled to the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB)

page and an LSB page. The memory cells may be programmed using a set coding scheme (e.g., an LDPC encoding).

The controller 100 may include a read processor 710 and a decoder 520. In some embodiments, the decoder 720 may be implemented with an LDPC decoder. These components may be implemented with the internal components of the control component 120 (i.e., firmware (FW)) in FIG. 2. Although not shown in FIG. 5, the controller 100 and the memory device 200 may include various components of the memory system 10 as shown in FIG. 2.

The read processor 710 may control read operations for the memory device 200, in response to a read request from a host (e.g., the host 5 of FIG. 1). The read processor 710 may perform a read operation on a target region in the memory device 200. The target region may be a page of a select block among the plurality of blocks in the memory device 200. The read operation may be performed using a select read level among a plurality of read levels. For example, as shown in FIG. 6, at the first error recovery stage, the first read level may be used for the read operation.

The decoder 720 may decode data associated with the read operation to generate a syndrome value. In some embodiments, the syndrome value includes a syndrome weight representing the number of unsatisfied check nodes, i.e., unsatisfied check node count (USC). The syndrome weight is obtained from $S=(s_1, s_2, \ldots, s_n)=c \cdot H^T$. Here c, H and S are a codeword, a parity check matrix and a syndrome weight, respectively. If the syndrome weight is equal to zero (0), it means that the codeword c has been successfully decoded. On the other hand, the codeword c has failed to decode if the syndrome weight is not equal to 0, i.e., the syndrome weight is greater than 0. For example, consider the two codewords $c_1$, $c_2$ in List1. Their respective syndrome weights are obtained as shown in List2. In List1, codeword $c_1$ has no error but codeword $c_2$ has one erroneous bit, i.e., a bit flip occurred. This erroneous bit is the last bit shown in bold. In List2, the superscript T denotes transpose.

$$c_1 = [0\ 0\ 0\ 1\ 1\ 0\ 1]$$
$$c_2 = [0\ 0\ 0\ 1\ 1\ 0\ 0]$$
List1

$$c_1 \cdot H^T = [0\ 0\ 0\ 1\ 1\ 0\ 1] \begin{bmatrix} 1 & 0 & 0 \\ 0 & 1 & 0 \\ 0 & 0 & 1 \\ 0 & 1 & 0 \\ 0 & 1 & 1 \\ 1 & 1 & 1 \\ 1 & 0 & 1 \end{bmatrix} = [0\ 0\ 0]$$

$$c_2 \cdot H^T = [0\ 0\ 0\ 1\ 1\ 0\ 0] \begin{bmatrix} 1 & 0 & 0 \\ 0 & 1 & 0 \\ 0 & 0 & 1 \\ 1 & 1 & 0 \\ 0 & 1 & 1 \\ 1 & 1 & 1 \\ 1 & 0 & 1 \end{bmatrix} = [1\ 0\ 1]$$
List2

In some embodiments, the decoder 720 may perform LDPC decoding. The LDPC decoding is performed between check nodes and variable nodes a set number of iterations. If the number of iterations is set to 100, the decoder 720 tries to decode up to 100 times. Although the number of iterations is set to 100, this number is considered the maximum allowable number of iterations; that is, the decoder 720 may stop decoding if and when the syndrome weight of the data being decoded becomes zero, before reaching the set (maximum) number of iterations. In other words, the decoder 720 may measure USC after each iteration. It is faster to compute the USC than to count the number of cells.

Figure 8:
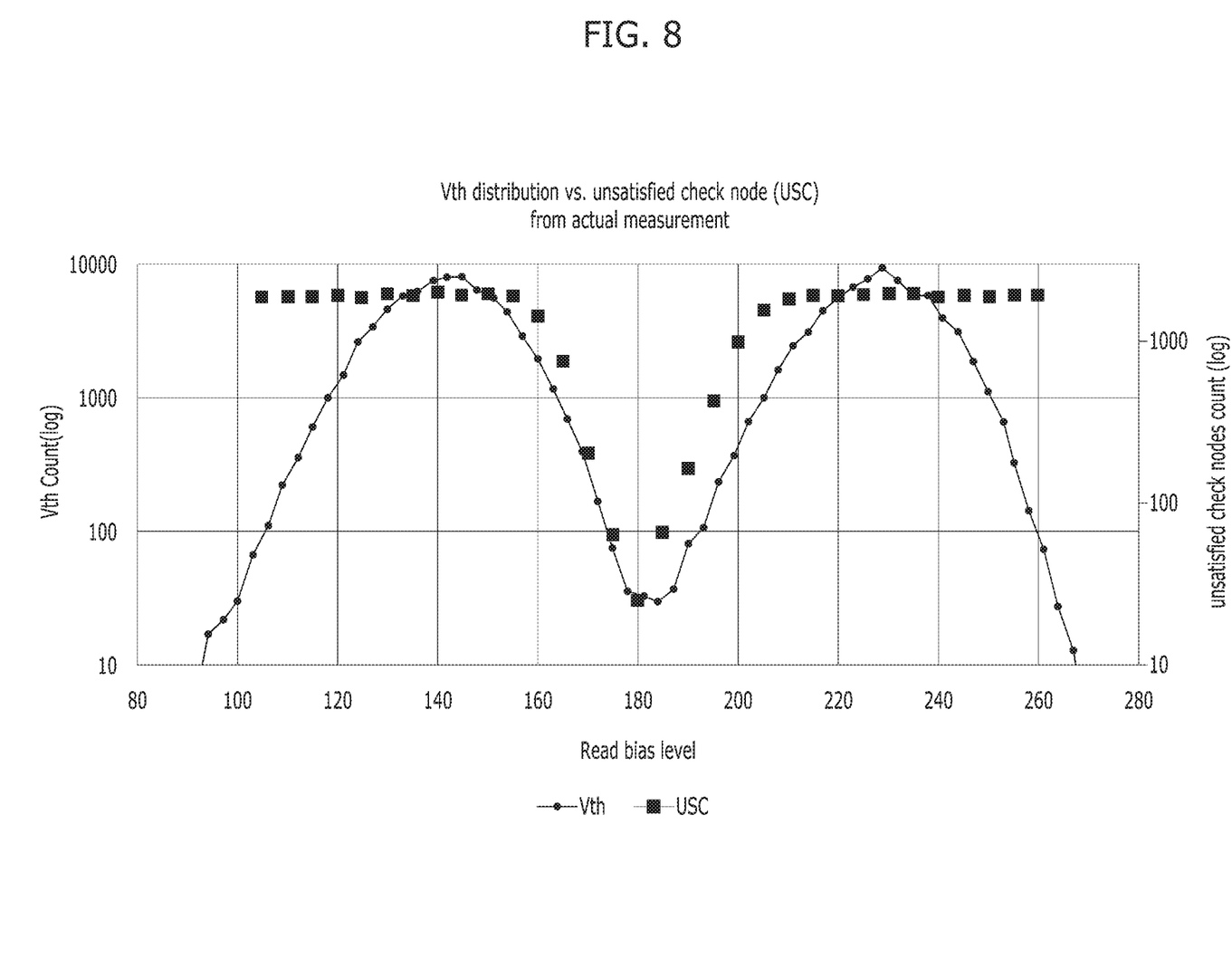
FIG. 8 is a graph illustrating a correlation between a threshold voltage (Vth) distribution and unsatisfied check node count (USC).

FIG. 8 illustrates a correlation between a threshold voltage (Vth) distribution and USC.

Referring to FIG. 8, an example of cell count numbers and USC results with sweeping read bias levels for one data unit is shown. First graph ( ━━●━━ ) at y-axis represents cell count numbers and second graph ( ━■━ ) at y-axis represents USC values. X-axis represents the applied read bias voltage levels. One data unit contains about 40K cells in general and each cell has different characteristic, so the voltage distribution for the 40K cells can be shown in FIG. 8. For example, when the read bias level 200 mv is applied to one data unit for the read operation, the results are collected with the cell count number about 500 and the USC value about 1000. FIG. 8 shows two program states partitioned by a read level bias of approximately 180. As FIG. 8 shows, USC has a high correlation with cell count, i.e., Vth count. The inventors have discovered that USC is significantly related to cell count, and thus that optimal read level may be determined using USC. When USC is relatively low, the corresponding read level is deemed to be an optimal read level. On the contrary, when USC is relatively high, the corresponding read level is not an optimal read level. In other words, USC represents how much threshold voltage distribution has changed. Decoding would fail even if decoding is performed at a read bias level corresponding to a relatively high USC for the maximum number of iterations. Thus, at higher USC counts, the controller 100 does not have to try to decode up to the maximum number of iterations. In general, the controller 100 may use different maximum number of iterations to correct read errors. Instead, the controller 100 may go to the next error recovery stage as shown in FIG. 9 and then try to decode data with a read level of the next error recovery stage.

Figure 9:
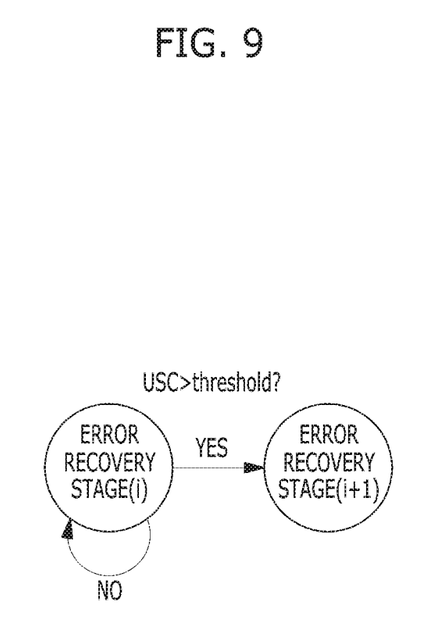
FIG. 9 illustrates a transition between adjacent error recovery stages in accordance with embodiments.

FIG. 9 illustrates a transition between adjacent error recovery stages in accordance with embodiments. As shown in FIG. 8, USC represents how much threshold voltage distribution has been changed. If USC is greater than a threshold, the read processor 710 may skip the current error recovery stage. In an example of FIG. 8, the threshold can be set with a value ranging from 1100 to 1200 which means very hard to correct read error. In an example of FIG. 9, if USC is greater than the threshold, error correction processing transitions from the current error recovery stage (i) to the next current error recovery stage (i+1). At the next error recovery stage (i+1), the read processor 710 may select a next read level among the plurality of read levels and use the next read level for a subsequent read operation. As previously noted, each error recovery stage has a corresponding read level. If USC is less than or equal to the threshold, the read processor 710 may continue in the current error recovery stage (i) and perform the next iteration of read operation.

As described above, the controller 100 determines whether or not the current read level at the current error recovery stage is an optimal read level, without decoding fully. When the controller 100 determines that the current read level is not the optimal read level, the controller 100 transitions the error recovery process to the next error recovery stage where decoding is attempted at the next read level. Through this scheme, latency may be reduced. Reduction of latency, in turn, allows additional error recovery stages to added to the error recovery flow without increasing the overall processing time.

Figure 10:
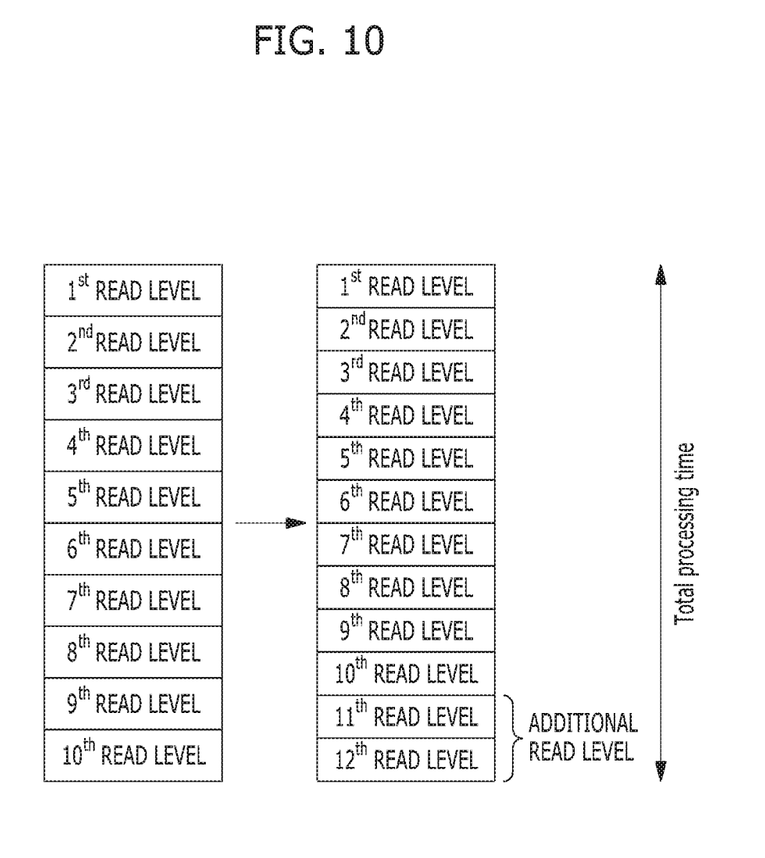
FIG. 10 illustrates that additional error recovery stages are added in an error recovery flow in accordance with embodiments.

Referring to FIG. 10, conventional error recovery flow includes 1st to 10th error recovery stages using 1st to 10th read levels. In accordance with embodiments, the error recovery flow includes 1st to 12th error recovery stages using 1st to 12th read levels, which include additional read levels (i.e., 11th and 12th read levels). For TLC, there are 7 read bias levels having different offset values. Table1 below shows one example for one read revel.

TABLE 1

| Read bias level | Offset value |
|---|---|
| 1st read level | Default bias |
| 2nd read level | Default − 2 |
| 3rd read level | Default + 2 |
| 4th read level | Default − 5 |
| 5th read level | Default + 5 |
| 6th read level | Default − 8 |
| 7th read level | Default + 8 |
| 8th read level | Default − 10 |
| 9th read level | Default + 10 |
| 10th read level | Default − 13 |
| 11th read level | Default + 13 |
| 12th read level | Default − 16 |

Figure 11:
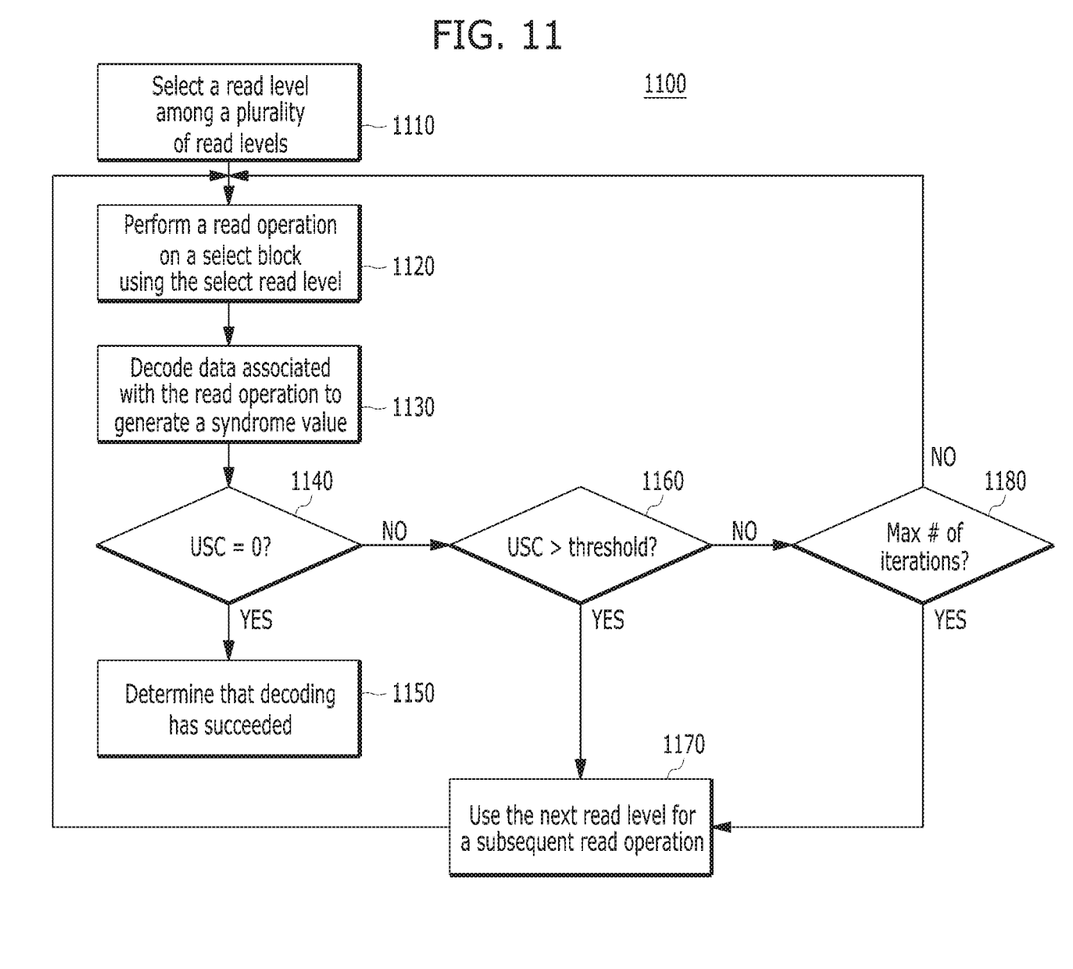
FIG. 11 is a flowchart illustrating an error recovery operation in accordance with an embodiment of the present invention.

FIG. 11 is a flowchart illustrating an error recovery operation 1100 in accordance with an embodiment of the present invention. The error recovery operation 1100 may be performed by components 710 and 720 of the controller 100 in FIG. 7.

Referring to FIG. 11, the error recovery operation 1100 may include steps 1110 to 1180. The error recovery operation 1100 may be performed on a select block of the plurality of blocks in the memory device 200 of FIG. 7.

At step 1110, the controller 100 may select a read level among a plurality of read levels. In some embodiments, the plurality of read levels may be a set sequence of read levels for the error recovery operation, and the selected read level is a first read level among the sequence of read levels.

At step 1120, the controller 100 may perform a read operation on the select block using the select read level.

At step 1130, the controller 100 may decode data associated with the read operation to generate a syndrome value. In some embodiments, the syndrome value includes a syndrome weight representing the number of unsatisfied check nodes or unsatisfied check nodes count (USC).

At step 1140, the controller 100 may determine whether the decoding failed or succeeded using USC. When it is determined that USC is zero (1140, YES), the controller 100 may determine that the decoding succeeded and thus stop the read operation, at step 1150. When it is determined that USC is not zero (1140, NO), the controller 100 may determine that the decoding failed and proceed to step 1160.

At step 1160, the controller 100 may determine whether USC is greater than a threshold. When it is determined that USC is greater than the threshold (1160, YES), the controller 100 may select and use a next read level in the sequence of read levels for a subsequent read operation, at step 1170.

When it is determined that USC is less than or equal to the threshold (1160, NO), the controller 100 may proceed to step 1180. At step 1180, the controller 100 may determine whether the read operation using the select read level and the decoding of the data have been performed a maximum number (#) of iterations.

When it is determined that the maximum number of iterations has not been reached (1180, NO), the controller 100 may perform another iteration of the read operation using the select read level at step 1120 and the decoding of the data at step 1130. When it is determined that the maximum number of iterations has been reached (1180, YES), the controller 100 may proceed to step 1170, where a next read level is selected and used for a subsequent read operation. After step 1170, the flow returns to step 1120 for additional processing.

Figure 12:
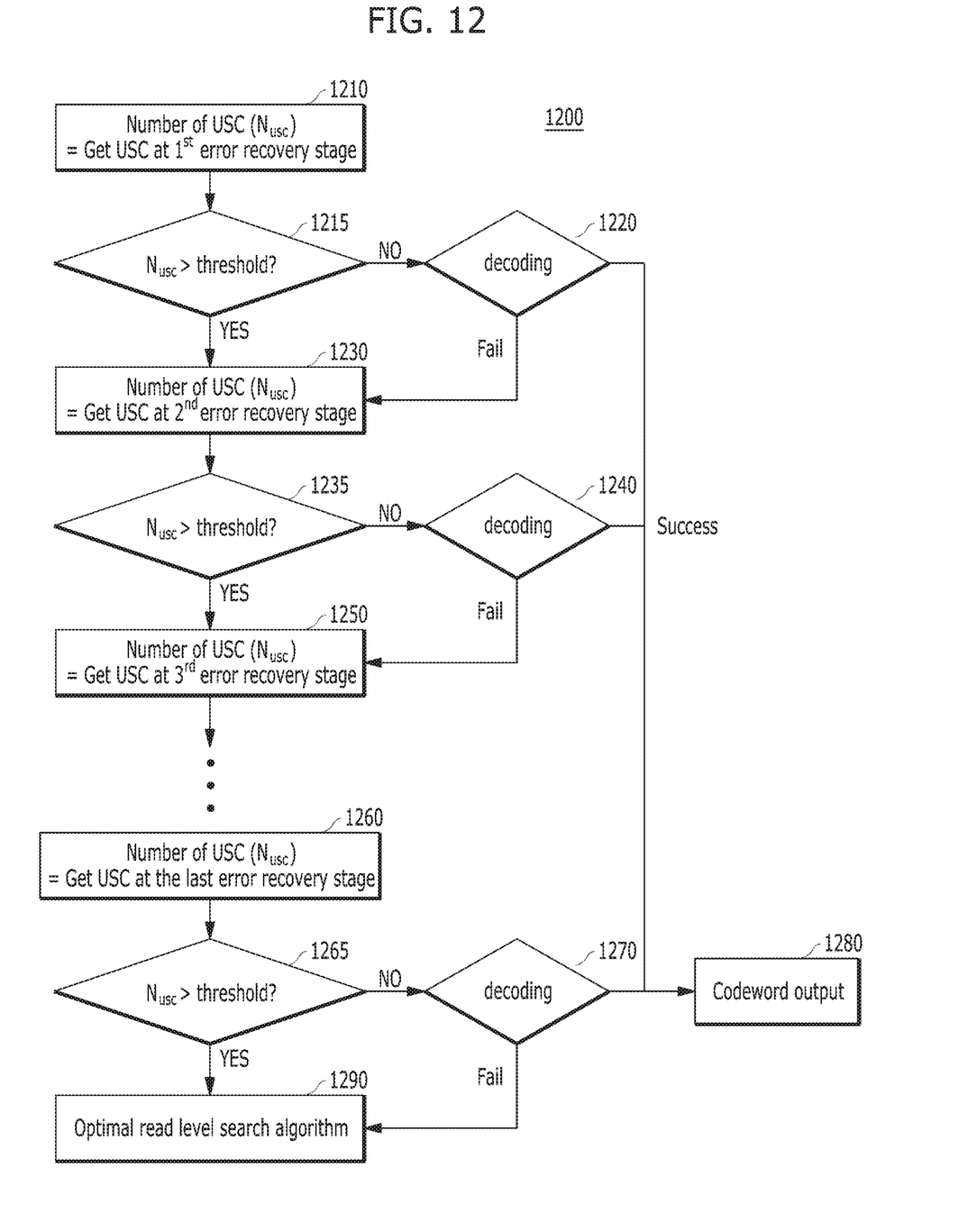
FIG. 12 is a flowchart illustrating an operation of error recovery stages in accordance with an embodiment of the present invention.

FIG. 12 is a flowchart illustrating an operation 1200 of error recovery stages in accordance with an embodiment of the present invention.

Referring to FIG. 12, the operation 1200 may include steps 1210 to 1290. The error recovery operation 1100 may be performed on a select block of the plurality of blocks in the memory device 200 of FIG. 7.

At step 1210, USC is obtained at the first error recovery stage. At step 1215, it is determined whether USC is greater than a threshold. When it is determined that USC is less than or equal to the threshold (1215, NO), it is determined whether decoding at the first error recovery stage succeeded at step 1220. When it is determined that decoding at the first error recovery stage succeeded (1220, Success), a corresponding decoded codeword is outputted at step 1280. When it is determined that decoding at the first error recovery stage failed (1220, Fail), step 1230 is performed. When it is determined that USC is greater than the threshold (1215, YES), step 1230 is performed as well.

At step 1230, USC is obtained at the second error recovery stage. At step 1235, it is determined whether USC is greater than a threshold. When it is determined that USC is less than or equal to the threshold (1235, NO), it is determined at step 1240 whether decoding at the second error recovery stage succeeded. When it is determined that decoding at the second error recovery stage succeeded (1240, Success), a corresponding decoded codeword is outputted at step 1280. When it is determined that decoding at the second error recovery stage failed (1240, Fail), step 1250 is performed.

At step 1250, USC is obtained at the third error recovery stage. Although not shown, operations similar to steps 1215 and 1220 are performed.

At step 1260, USC is obtained at the last error recovery stage. At step 1265, it is determined whether USC is greater than a threshold. When it is determined that USC is less than or equal to the threshold (1265, NO), it is determined at step 1270 whether decoding at the last error recovery stage succeeded. When it is determined that decoding at the last error recovery stage succeeded (1270, Success), a corresponding decoded codeword is outputted at step 1280. When it is determined that decoding at the last error recovery stage failed (1270, Fail), step 1290 is performed. At step 1290, an optimal read level search algorithm is performed since decoding at each of multiple error recovery stages has failed.

As described above, embodiments provide an error recovery scheme to know whether a read level applied at each error recovery stage is optimal using a syndrome value (i.e., unsatisfied check nodes count (USC)). When it is determined that USC at the current error recovery stage is greater than a threshold, the error recovery scheme moves to the next error recovery stage without completing the maximum number of iterations at the current error recovery stage. Thus, various embodiments reduce latency associated with reading and decoding of data.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
a memory device including a plurality of blocks; and
a controller coupled to the memory device and suitable for:
performing a read operation on a select block among the plurality of blocks using a select read level among a sequence of read levels;
decoding data associated with the read operation at the select read level to generate a syndrome value;
determining whether to stop, before a maximum number of iterations of an error recovery stage has occurred, the read operation and the decoding at the select read level when the syndrome value for the select read level exceeds a threshold indicating that error correction at the select read level would fail;
when it is determined to stop the read operation and the decoding at the select read level, selecting a next read level in the sequence of read levels; and
using the next read level for a subsequent read operation for a next error correction stage.

2. The memory system of claim 1, wherein the controller compares the syndrome value with the threshold, wherein the threshold is greater than zero, and stops the read operation and the decoding at the select read level when the syndrome value is greater than the threshold.

3. The memory system of claim 1, wherein the controller further determines whether the decoding has failed or succeeded based on the syndrome value.

4. The memory system of claim 3, wherein the controller:
determines that the decoding has failed when the syndrome value is not zero; and
determines that the decoding has succeeded and stops the read operation when the syndrome value is zero.

5. The memory system of claim 4, wherein the controller repetitively performs the performing of the read operation using the select read level and the decoding of the data the maximum number of iterations when it is determined that the syndrome value is less than or equal to the threshold.

6. The memory system of claim 5, wherein the controller determines whether the read operation has been performed the maximum number of iterations, and
wherein the controller selects the next read level when it is determined that the read operation has been performed the maximum number of iterations.

7. The memory system of claim 1, wherein the syndrome value includes a syndrome weight representing a number unsatisfied check nodes.

8. A method for operating a memory system, which includes a memory device including a plurality of blocks and a controller coupled to the memory device, the method comprising:
performing a read operation on a select block among the plurality of blocks using a select read level among a sequence of read levels;
decoding data associated with the read operation at the select read level to generate a syndrome value;
determining whether to stop, before a maximum number of iterations of an error recovery stage has occurred, the read operation and the decoding at the select read level when the syndrome value for the select read level exceeds a threshold indicating that error correction at the select read level would fail;
when it is determined to stop the read operation and the decoding at the select read level, selecting a next read level in the sequence of read levels; and
using the next read level for a subsequent read operation for a next error correction stage.

9. The method of claim 8, wherein the determining of whether to stop the read operation and the decoding at the select read level includes:
comparing the syndrome value with the threshold, wherein the threshold is greater than zero; and
stopping the read operation and the decoding at the select read level when the syndrome value is greater than the threshold.

10. The method of claim 8, further comprising:
determining whether the decoding has failed or succeeded based on the syndrome value.

11. The method of claim 10, wherein the determining of whether the decoding fails or succeeds includes:
when the syndrome value is not zero, determining that the decoding fails; and when the syndrome value is zero, determining that the decoding succeeded and stopping the read operation.

12. The method of claim 11, wherein the performing of the read operation using the select read level and the decoding of the data are repetitively performed a maximum number of iterations when it is determined that the syndrome value is less than or equal to the threshold.

13. The method of claim 12, further comprising:
determining whether the read operation has been performed the maximum number of iterations, and
wherein the selecting of the next read level is performed when it is determined that the read operation has been performed the maximum number of iterations.

14. The method of claim 8, wherein the syndrome value includes a syndrome weight representing a number of unsatisfied check nodes.

* * * * *